(12) United States Patent
Moon et al.

(10) Patent No.: US 9,589,640 B2
(45) Date of Patent: Mar. 7, 2017

(54) DATA STORAGE DEVICE INCLUDING NONVOLATILE MEMORY DEVICE AND OPERATING METHOD THEREOF

(71) Applicant: SAMSUNG ELECTRONICS CO., LTD., Suwon-si, Gyeonggi-do (KR)

(72) Inventors: Sangkwon Moon, Osan-si (KR); Sang-Hwa Han, Suwon-si (KR); Seungkyung Ro, Anyang-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/991,173

(22) Filed: Jan. 8, 2016

(65) Prior Publication Data

US 2016/0203870 A1 Jul. 14, 2016

(30) Foreign Application Priority Data

Jan. 9, 2015 (KR) .................. 10-2015-0003363

(51) Int. Cl.
| | |
|---|---|
| G11C 16/26 | (2006.01) |
| G11C 16/04 | (2006.01) |
| G11C 16/06 | (2006.01) |
| G11C 16/08 | (2006.01) |
| G11C 16/10 | (2006.01) |
| G11C 16/28 | (2006.01) |
| G11C 16/34 | (2006.01) |
| G11C 16/32 | (2006.01) |

(52) U.S. Cl.
CPC .......... *G11C 16/0483* (2013.01); *G11C 16/06* (2013.01); *G11C 16/08* (2013.01); *G11C 16/10* (2013.01); *G11C 16/26* (2013.01); *G11C 16/28* (2013.01); *G11C 16/349* (2013.01); *G11C 16/3495* (2013.01); *G11C 16/0466* (2013.01); *G11C 16/32* (2013.01)

(58) Field of Classification Search
CPC ..... G11C 16/16; G11C 16/26; G11C 16/0466; G11C 16/0483
See application file for complete search history.

(56) References Cited

U.S. PATENT DOCUMENTS 5,923,606 A * 7/1999 Lee .................. H01L 27/112
                                                    257/E27.102
6,614,688 B2   9/2003 Jeong et al.
(Continued)

FOREIGN PATENT DOCUMENTS

| JP | 11-086571 | 3/1999 |
| KR | 1020100106767 | 10/2010 |
| KR | 1020130072083 | 7/2013 |

*Primary Examiner* — Douglas King
(74) *Attorney, Agent, or Firm* — F. Chau & Associates, LLC

(57) ABSTRACT

A method of a operating a data storage device including a nonvolatile memory device and a memory controller is provided. The method includes reading a first selection transistors connected to a first selection line from among a plurality of selection lines with a reference voltage, determining whether a first number of selection transistors, from among the first selection transistors, which have a threshold voltage less than the reference voltage is larger than a first reference value, and if the first number is larger than the first reference value, programming the first selection transistors to have threshold voltage larger than or equal to a target voltage.

18 Claims, 15 Drawing Sheets

(56) References Cited

U.S. PATENT DOCUMENTS

| | | | |
|---|---|---|---|
| 7,177,192 B2 | 2/2007 | Yoon et al. | |
| 7,660,163 B2 * | 2/2010 | Ahn | G11C 16/34 |
| | | | 365/185.11 |
| 7,679,133 B2 | 3/2010 | Son et al. | |
| 8,089,816 B2 | 1/2012 | Yamada et al. | |
| 8,208,305 B2 * | 6/2012 | Tanzawa | G11C 16/0483 |
| | | | 365/185.17 |
| 8,295,091 B2 | 10/2012 | Itagaki et al. | |
| 8,467,246 B2 | 6/2013 | Kim et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2011/0233648 A1 | 9/2011 | Seol et al. | |
| 2013/0088921 A1 * | 4/2013 | Nam | G11C 16/0483 |
| | | | 365/185.17 |
| 2013/0114345 A1 * | 5/2013 | Lee | G11C 16/0483 |
| | | | 365/185.22 |
| 2014/0233316 A1 | 8/2014 | Shim et al. | |
| 2016/0071596 A1 * | 3/2016 | Lee | G11C 16/10 |
| | | | 365/185.22 |

* cited by examiner

US 9,589,640 B2

DATA STORAGE DEVICE INCLUDING NONVOLATILE MEMORY DEVICE AND OPERATING METHOD THEREOF

CROSS-REFERENCE TO RELATED APPLICATION

This application claims priority under 35 USC §119 to Korean Patent Application No. 10-2015-0003363, filed on Jan. 9, 2015 in the Korean Intellectual Property Office, the disclosure of which is incorporated by reference herein in its entirety.

TECHNICAL FIELD

The present inventive concept relates to a data storage device including a nonvolatile memory device and a programming method of the data storage device.

DISCUSSION OF RELATED ART

Nonvolatile memory devices retain data without power supply. As the number of program/erase cycles of nonvolatile memory devices increases, the distribution in threshold voltages of selection transistors of the nonvolatile memory devices spreads. Nonvolatile memory devices may include a string selection transistor or a ground selection transistor. Such distribution of selection transistors may cause on-cell current amount flowing to a string to vary among strings to the extent that a erase operation or a read operation may need more operation time to complete.

SUMMARY

According to an exemplary embodiment of the present inventive concept, a method of operating a data storage device including a nonvolatile memory device and a memory controller configured to control the nonvolatile memory device is provided. The nonvolatile memory device includes a plurality of memory blocks. Each memory block includes a first cell string and a second cell string that are connected to a bit line from among a plurality of bit lines. Each cell string includes selection transistors and serially-connected memory cells. The selection transistors includes at least one string selection transistor (SST) and at least one ground selection transistor (GST). The SST of the first cell string and the SST of the second cell string are connected to different selection lines from among a plurality of selection lines, respectively. And the GST of the first cell string and the GST of the second cell string are connected to a same selection line from among the plurality of selection lines or different selection lines from among a plurality of selection lines, respectively. The method includes reading a first selection transistors connected to a first selection line from among the plurality of selection lines with a reference voltage, determining whether a first number of selection transistors, from among the first selection transistors, which have a threshold voltage less than the reference voltage is larger than a first reference value, and if the first number is larger than the first reference value, programming the first selection transistors to have threshold voltage larger than or equal to a target voltage.

A method of operating a data storage device including a nonvolatile memory device and a memory controller configured to control the nonvolatile memory device is provided. The nonvolatile memory device includes a plurality of memory blocks. Each memory block includes a first cell string and a second cell string that are connected to a bit line from among a plurality of bit lines. Each cell string includes selection transistors and serially-connected memory cells. The selection transistors includes at least one string selection transistor (SST) and at least one ground selection transistor (GST). The SST of the first cell string and the SST of the second cell string are connected to different selection lines from among a plurality of selection lines, respectively. And the GST of the first cell string and the GST of the second cell string are connected to a same selection line from among the plurality of selection lines or different selection lines from among a plurality of selection lines, respectively. The method includes reading selection transistors connected to each selection line of a memory block with a reference voltage, assigning order of priority to the each selection line according to a number of selection transistors which have a threshold voltage less than the reference voltage, and programming selection transistors connected to the each selection line to have threshold voltage larger than or equal to a target voltage according to the order of priority.

A method of operating a data storage device including a nonvolatile memory device and a memory controller configured to control the nonvolatile memory device is provided. The nonvolatile memory device includes a plurality of memory blocks. Each memory block includes a first cell string and a second cell string that are connected to a bit line from among a plurality of bit lines. Each cell string includes selection transistors and serially-connected memory cells. The selection transistors includes at least one string selection transistor (SST) and at least one ground selection transistor (GST). The SST of the first cell string and the SST of the second cell string are connected to different selection lines from among a plurality of selection lines, respectively. And the GST of the first cell string and the GST of the second cell string are connected to a same selection line from among the plurality of selection lines or different selection lines from among a plurality of selection lines, respectively. The method includes reading selection transistors included in the each memory block with a reference voltage, assigning order of priority to the each memory block according to a number of selection transistors which have a threshold voltage less than the reference voltage, and programming selection transistors included in the each memory block to have threshold voltage larger than or equal to a target voltage according to the order of priority.

A method of operating a data storage device including a nonvolatile memory device and a memory controller configured to control the nonvolatile memory device is provided. The nonvolatile memory device includes a plurality of memory blocks. Each memory block includes a first cell string and a second cell string that are connected to a bit line from among a plurality of bit lines. Each cell string includes selection transistors and serially-connected memory cells. The selection transistors includes at least one string selection transistor (SST) and at least one ground selection transistor (GST). The SST of the first cell string and the SST of the second cell string are connected to different selection lines from among a plurality of selection lines, respectively. And the GST of the first cell string and the GST of the second cell string are connected to a same selection line from among the plurality of selection lines or different selection lines from among a plurality of selection lines, respectively. The method includes reading selection transistors connected to at least one selection line of a first memory block with a reference voltage, determining whether a first number of selection transistors, connected to the at least one selection line of the first memory block, which have a threshold voltage less than the reference voltage is larger than a first reference value, and if the first number is larger than the first reference value, programming the selection transistors connected to the at least one selection line of the first memory block to have threshold voltage larger than or equal to a target voltage.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
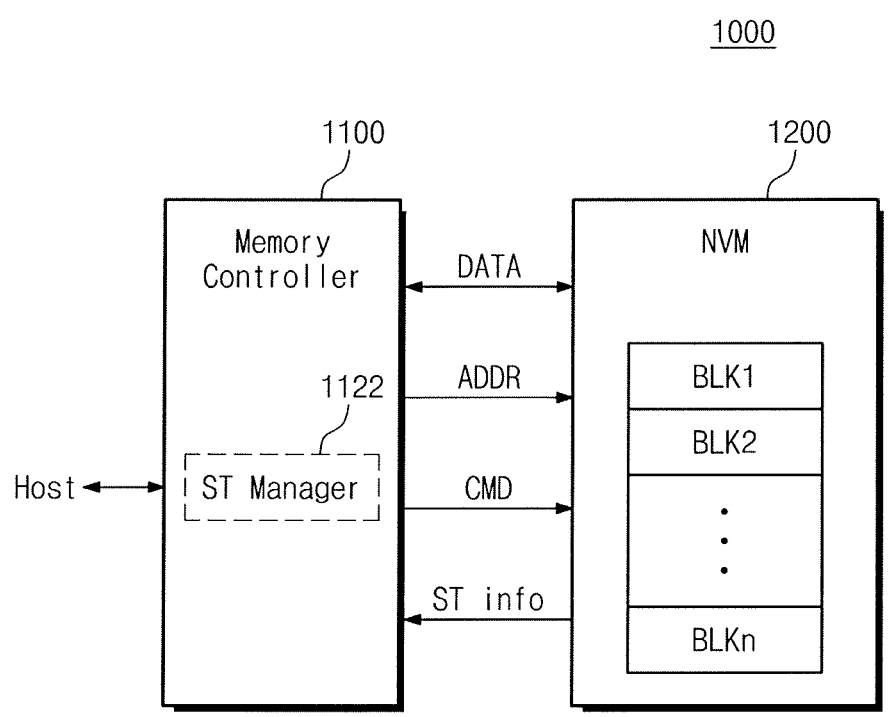
FIG. 1 is a block diagram of a data storage device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram of a data storage device 1000 according to an exemplary embodiment of the present inventive concept. As illustrated, the data storage device 1000 may include a memory controller 1100 and a nonvolatile memory device 1200.

The memory controller 1100 may write data into the nonvolatile memory device or read data stored in the nonvolatile memory device 1200 in response to a request from a host. The memory controller 1100 may transmit an address ADDR, and a command CMD to the nonvolatile memory device 1200 to write data into the nonvolatile memory device 1200 or read data stored in the nonvolatile memory device 1200.

The memory controller 1100 may manage selection transistors of each of a plurality of memory blocks BL1 to BLn constituting the nonvolatile memory device 1200. A selection transistor (ST) manager 1122 may be used to manage the selection transistors. The selection transistor manager 1122 may be implemented in firmware or in logic circuits.

For example, the selection transistor manager 1122 may determine whether the number of selection transistors whose threshold voltages are less than a reference voltage is smaller than or equal to a reference value, according to the number of program/erase cycles. This determination operation may be performed immediately before or after an erase operation is performed on a memory block. Information about a memory block in which the number of selection transistors whose threshold voltages are less than a reference voltage is smaller than or equal to a reference value may be stored in the selection transistor manager 1122.

Selection transistors of a memory block may be programmed to have a threshold voltage above a target voltage. The target voltage may be larger than or equal to the reference voltage. The program operation may be performed at a time point after reference time elapses from an erase operation on a memory block (the time point will be understood to be substantially identical to "the program operation may be performed a time point after the reference time elapses from reading the selection transistors with a reference voltage"). For example, a time point at which the reference time elapses from an erase operation on a memory block may be a time point after a read operation, a program operation or an erase operation is performed on a nonvolatile memory device, a time point at which the data storage device 1000 is in idle time or a time point at which a notification permitting a background operation to be performed is received from a host. If the memory controller 1100 is idle, no read operation or erase operation is issued to the nonvolatile memory device 1200. However, a program operation may be exceptionally performed immediately when it is determined that a selection transistor needs to be programmed fast. As a result, performance of a data storage device may be increased.

Figure 2:
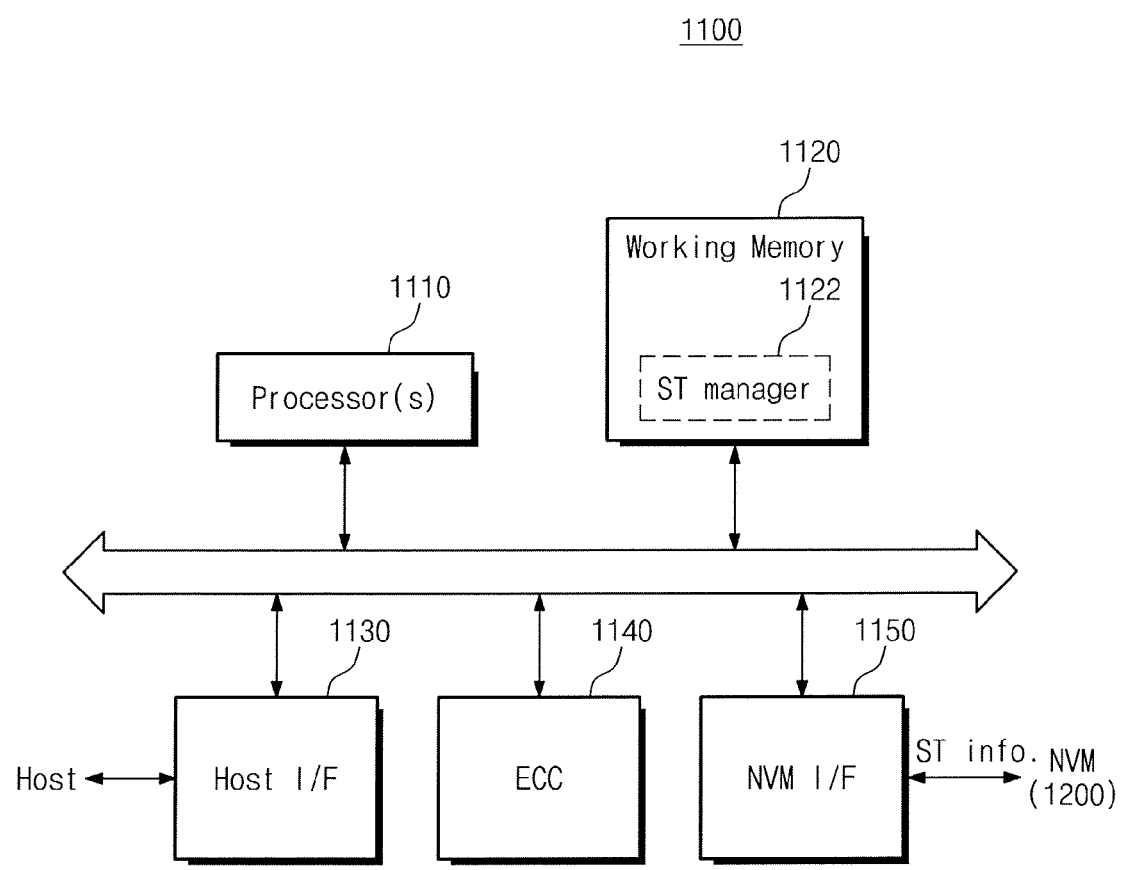
FIG. 2 is a block diagram of a memory controller in FIG. 1 according to an exemplary embodiment of the present inventive concept.

FIG. 2 is a block diagram of the memory controller 1100 in FIG. 1 according to an exemplary embodiment of the present inventive concept. As illustrated, the memory controller 1100 may include at least one processor 1110, a working memory 1120, a host interface 1130, an ECC (error correcting code) circuit 1140, and a nonvolatile memory interface 1150. The memory controller 1100 may further include a read-only memory (ROM) to store code data required for an initial booting operation.

The processor 1110 may control the overall operation of the memory controller 1100. The processor 1110 may operate the memory controller 1100 according to firmware. The firmware may be loaded in the working memory 1120 and may include a selection transistor manager and a flash translation layer (FTL).

Software and firmware may be loaded in the working memory 1120 to control the memory controller 1100. For example, the selection transistor manager 1122 may be loaded in the working memory 1120. The working memory 1120 may include at least one of a cache memory, a dynamic random access memory (DRAM), a static random access memory (SRAM), a phase change RAM (PRAM), and a flash memory.

The host interface 1130 may provide an interface between a host and the memory controller 1100. The host and the memory controller 1100 may be connected via at least one of various standardized interfaces. The standardized interfaces may include ATA (Advanced Technology Attachment), SATA (Serial ATA), e-SATA (external SATA), SCSI (Small Computer Small Interface), SAS (Serial Attached SCSI), PCI (Peripheral component Interconnection), PCI-E (PCI Express), USB (Universal Serial Bus), IEEE 1394, or a Card interface.

The ECC circuit 1140 may generate an error correction code (ECC) to correct a fail bit or an error bit of data received from the flash memory device 1200. The ECC circuit 1140 may perform error correction encoding of data provided to the flash memory device 1200 to generate parity-bit-added data. A parity bit may be stored in the flash memory 1200.

The nonvolatile memory interface 1150 may provide an interface between the memory controller 1100 and the nonvolatile memory device 1200. For example, the memory controller 1100 may transmit/receive data to/from the nonvolatile memory device 1200 via the nonvolatile memory interface 1150. The memory controller 1100 may receive information about a memory block in which a selection transistor needs to be programmed, via the nonvolatile memory interface 1150.

Figure 3:
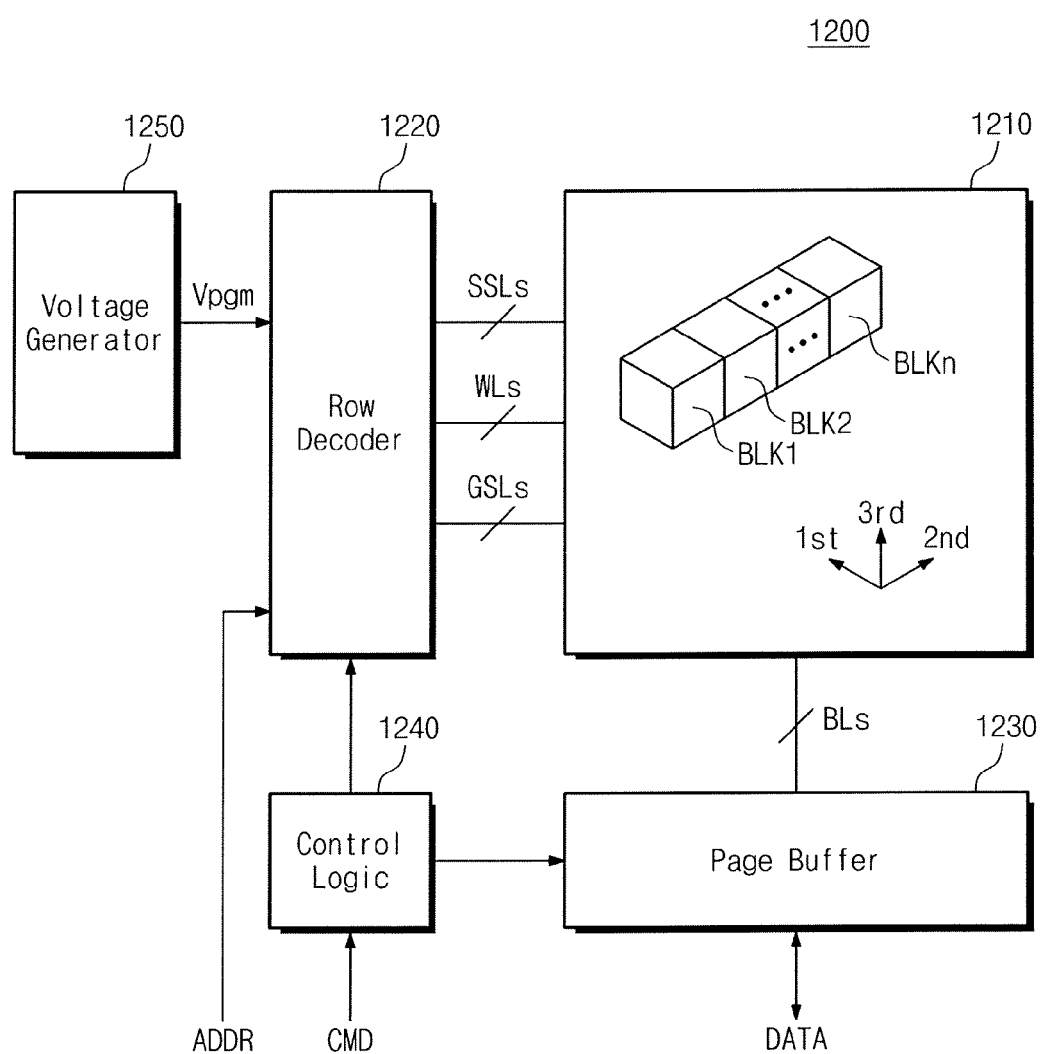
FIG. 3 is a block diagram of a nonvolatile memory device in FIG. 1 according to an exemplary embodiment of the present inventive concept.

FIG. 3 is a block diagram of a nonvolatile memory device 1200 in FIG. 1 according to an exemplary embodiment of the present inventive concept. As illustrated, the nonvolatile memory device 1200 may include a memory cell array 1210, a row decoder 1220, a page buffer circuit 1230, a control logic 1240, and a voltage generator 1250.

The memory cell array 1210 may include a plurality of blocks BLK1 to BLKn. Each of the memory blocks BLK1 to BLKn may have a three-dimensional structure. In a memory block having a three-dimensional structure, memory cells constituting a memory block may be formed in a direction perpendicular to a substrate. Each of the memory cells may store one or more bits of data. Selection transistors included in each memory block may have the same structure as memory cells storing data. For example, if the memory cells are of charge trap flash (CFR), the selection transistor may be a charge trap type transistor.

The row decoder 1220 may select one of a plurality of memory blocks in response to a row address ADDR. The row decoder 1220 may receive various wordline voltages to drive wordlines WLs from the voltage generator 1150. For example, the wordline voltages may include a program voltage, a pass voltage, an erase voltage, a verify voltage, a read voltage, or a read pass voltage. The row decoder 1220 may transmit the received wordline voltages to the wordlines WLs.

The page buffer circuit 1230 may function as a write driver or a sense amplifier according to an operation mode. For example, the page buffer circuit 1230 may function as a sense amplifier during a read operation or function as a write driver during a write operation. The page buffer circuit 1230 may include a plurality of page buffers that correspond to a plurality of bitlines BLs, respectively.

The control logic 1240 may control the row decoder 1220 and the page buffer 1230 in response to a received command CMD. For example, the control logic 1250 may control the row decoder 1220 and the page buffer circuit 1230 to program data DATA into the memory cell array 1210 in response to the command CMD. For example, the control logic 1250 may control the row decoder 1220 and the page buffer circuit 1230 to output programmed data DATA to the memory cell array 1210 in response to the command CMD.

The voltage generator 1250 may generate various wordline voltages to drive a wordline according to an operation mode. The wordline voltages may include a program voltage, a pass voltage, an erase voltage, a verify voltage, a read voltage, or a read pass voltage. For example, a program voltage Vpgm may be a voltage used to drive selection transistors of a memory block constituting the memory cell array 1210.

Figure 4:
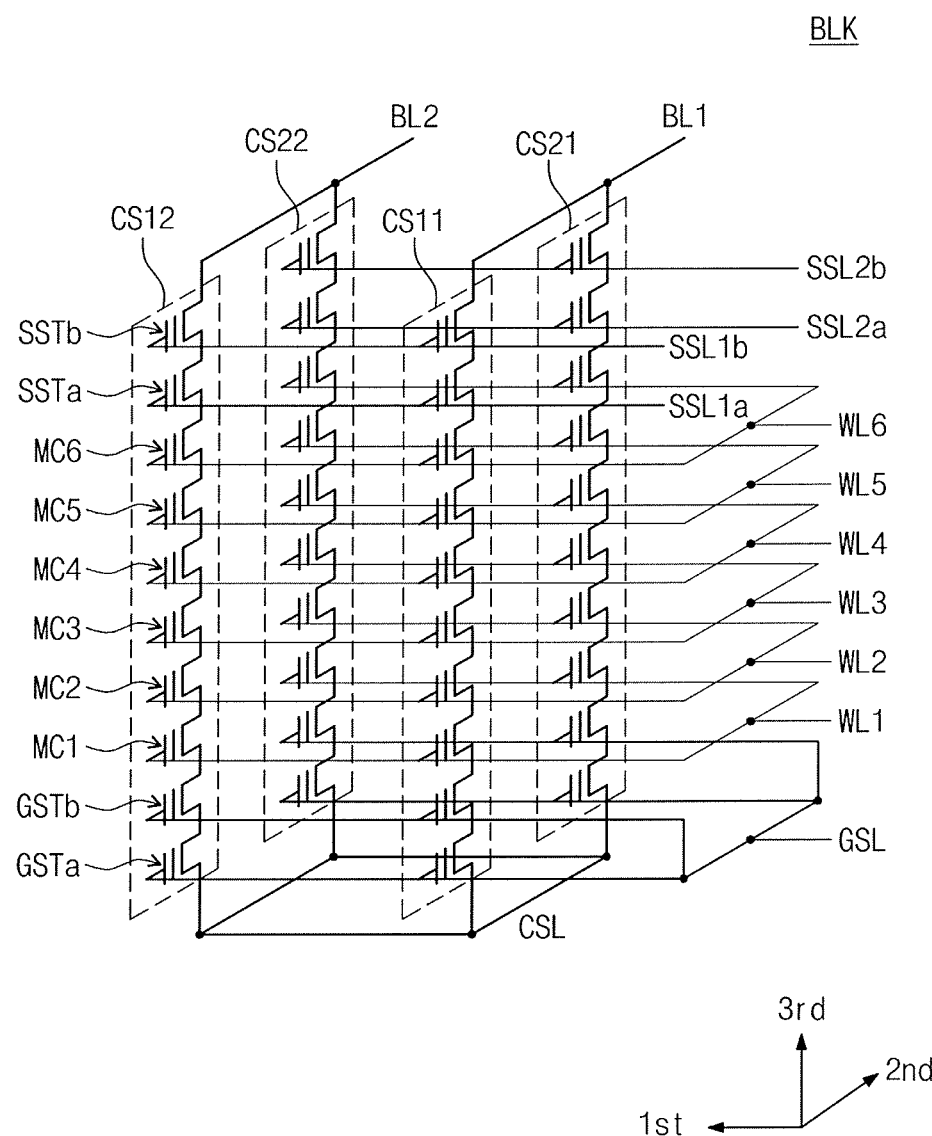
FIG. 4 is a circuit diagram of a memory block having a selection transistor according to an exemplary embodiment of the present inventive concept.

FIG. 4 is a circuit diagram of a memory block BLK according to an exemplary embodiment of the present inventive concept. As illustrated, the memory block BLK may include a plurality of cell strings CS11 to CS22. The cell strings CS11 to CS22 may be arranged in a first direction (1st) and a second direction (2nd) to form rows and columns.

For example, the cell strings CS11 and CS12 arranged in the first direction (1st) may form a first row, and the cell strings CS21 and CS22 arranged in the first direction (1st) may form a second row. The cell strings CS11 and CS21 arranged in the second direction (2nd) may form a first column, and the cell strings CS12 and CS22 arranged in the second direction (2nd) may form a second column.

Each cell string may include a plurality of cell transistors. The cell transistors may include ground selection transistors GSTa and GSTb, memory cells MC1 to MC6, and string selection transistors SSTa and SSTb. The ground selection transistors GSTa and GSTb, the memory cells MC1 to MC6, and the string selection transistors SSTa and SSTb of each cell string may be stacked in a direction perpendicular to a plane arranged in the first direction and the second direction. For example, the plane may be a plane on which a memory block may be disposed.

The cell transistors may be charge trap type transistors having threshold voltages that vary depending on the amount of charges trapped in an insulating layer of the cell transistor. In this case, the string selection transistors SSTa and SSTb and the ground selection transistors GSTa and GSTb may also be charge trap type transistors.

The ground selection transistors GSTa and GSTb of the cell strings CS11 to CS22 may be commonly connected to a ground selection line GSL.

Alternatively, the ground selection transistors GSTa and GSTb may be connected to different ground selection lines GSL. For example, ground selection transistors of the same height (or order) may be connected to the same ground selection line. For example, ground selection transistors GSTa of the first height may be commonly connected to the first ground selection line, and ground selection transistors GSTb of the second height may be commonly connected to the second ground selection line. In this case, the first ground selection transistors GSTa of the first height is lower than the second ground selection transistors GSTb of the second height.

Memory cells disposed at the same height (or order) from a substrate (or ground selection transistors GST) may be commonly connected to a single wordline, and memory cells disposed at different heights (or orders) from the substrate (or the ground selection transistors GST) may be connected to different wordlines WL1 to WL6, respectively. For example, memory cells MC1 are commonly connected to the wordline WL1. Memory cells MC2 are commonly connected to the wordline WL2. Memory cells MC3 are commonly connected to the wordline WL3. Memory cells MC4 are commonly connected to the wordline WL4. Memory cells MC5 are commonly connected to the wordline WL5. Memory cells MC6 are commonly connected to the wordline WL6.

In first string selection transistors SSTa of the same height (or order) of the cell strings CS11 to CS21 and CS12 to CS22, first string selection transistors SSTa of different rows are connected to different string selection lines SSL1a to SSL2a, respectively. For example, first string selection transistors SSTa of the cell strings CS11 and CS12 are commonly connected to the string selection line SSL1a. First string selection transistors SSTa of the cell strings CS21 and CS22 are commonly connected to the string selection line SSL2a.

In second string selection transistors SSTb of the same height (or order) of the cell strings CS11 to CS21 and CS12 to CS22, second string selection transistors SSTb of different rows are connected to different string selection lines SSL1b to SSL2b, respectively. For example, second string selection transistors SSTb of the cell strings CS11 and CS12 are commonly connected to the string selection line SSL1b. Second string selection transistors SSTb of the cell strings CS21 and CS22 are commonly connected to the string selection line SSL2b.

For example, string selection transistors of cell strings of the same row may be commonly connected to a single string selection line. For example, string selection transistors SSTa and SSTb of the cell strings CS11 and CS12 of a first row may be commonly connected to a single string selection line. String selection transistors SSTa and SSTb of the cell strings CST21 and CS22 of a second row may be commonly connected to a single string selection line.

Columns of the cell strings CS11 to CS21 and CS12 to CS22 are connected to different bitlines BL1 and BL2, respectively. For example, string selection transistors SSTb of the cell strings CS11 to CS21 of a first column are commonly connected to a bitline BL1. String selection transistors SSTb of the cell strings CS12 to CS22 of a second column are commonly connected to a bitline BL2.

The memory block BLK shown in FIG. 4 is exemplary. The present inventive concept is not limited to the memory block BLK shown in FIG. 4. For example, the number of rows of cell strings may increase or decrease. As the number of the rows of the cell strings varies, the number of string selection lines or ground selection lines connected to the rows of the cell strings and the number of cell strings connected to a single bitline may also vary.

The number of columns of cell strings may increase or decrease. As the number of the columns of the cell strings varies, the number of bitlines connected to the columns of the cell strings and the number of cell strings connected to a single string selection line may also vary.

Height of cells strings may increase or decrease. For example, the number of ground selection transistors, memory cells or string selection transistors respectively stacked in the cell strings may increase or decrease.

For example, a read operation and a write operation may be performed in units of rows of the cell strings CS11 to CS21 and CS12 to CS22. The cell strings CS11 to CS21 and CS12 to CS22 may be selected in unit of a single row by the string selection lines SSL1a, SSL1b, SSL2a, and SSL2b.

In a selected row of the cell strings CS11 to CS22, write and read operations may be performed in units of wordlines. In a selected row of the cell strings CS11 to CS22, memory cells connected to a selected wordline may be programmed.

Figure 5:
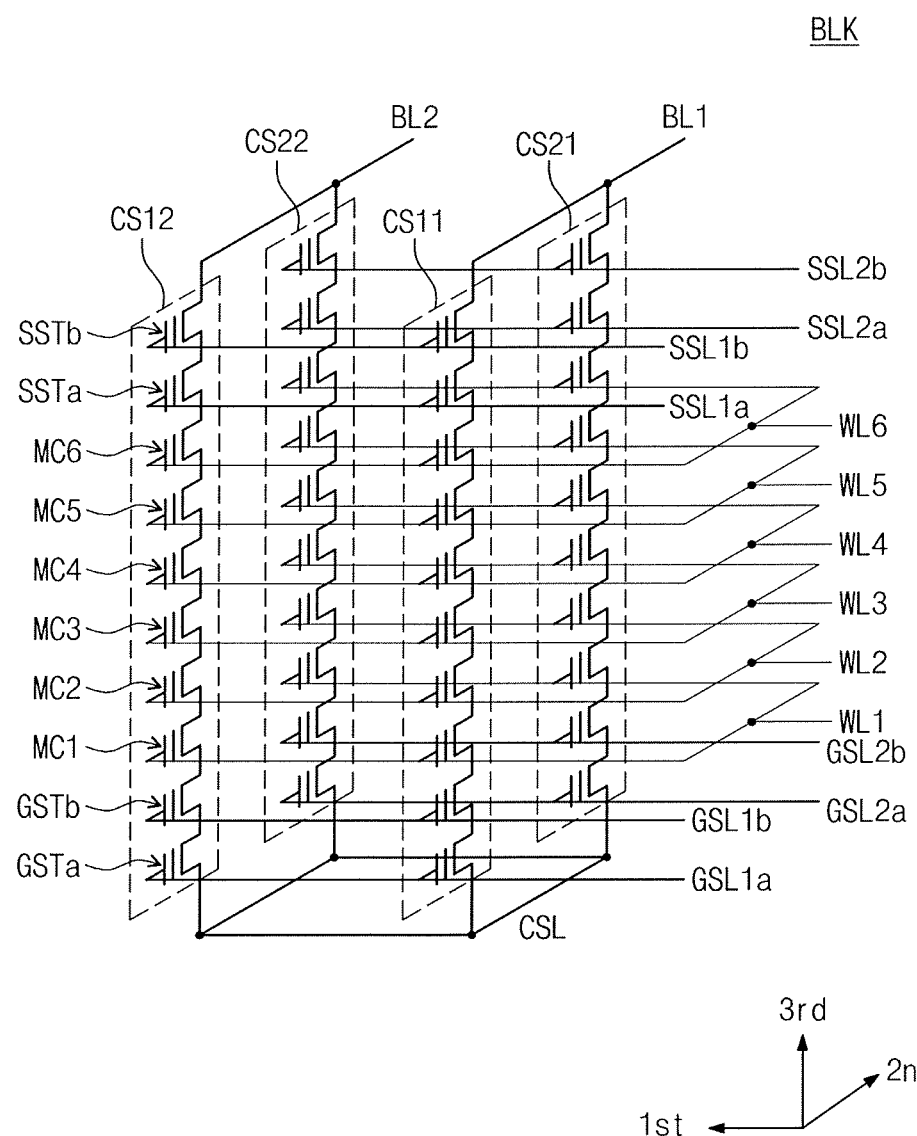
FIG. 5 is a circuit diagram of a memory block having a selection transistor according to an exemplary embodiment of the present inventive concept.

FIG. 5 is a circuit diagram of a memory block according to an exemplary embodiment of the present inventive concept.

Referring to FIG. 5, ground selection transistors of the same row may be connected to the same ground selection line and ground selection transistors of different rows may be connected to different ground selection lines. For example, ground selection transistors GSTa of cell strings CS11 and CS12 may be connected to a ground selection line GSL1a and ground selection transistors GSTb of the cell strings CS11 and CS12 may be connected to a ground selection line GSL1b. Ground selection transistors GSTa of cell strings CS21 and CS22 may be connected to a ground selection line GSL2a and ground selection transistors GSTb of the cell strings CS21 and CS22 may be connected to a ground selection line GSL2b.

Although not shown in the drawing, the ground selection transistors GSTa and GSTb of the cell strings CS11 and CS12 may be connected to the same ground selection line and the ground selection transistors GSTa and GSTb of the cell strings CS21 and CS22 may be connected to different ground selection lines.

Figure 6A:
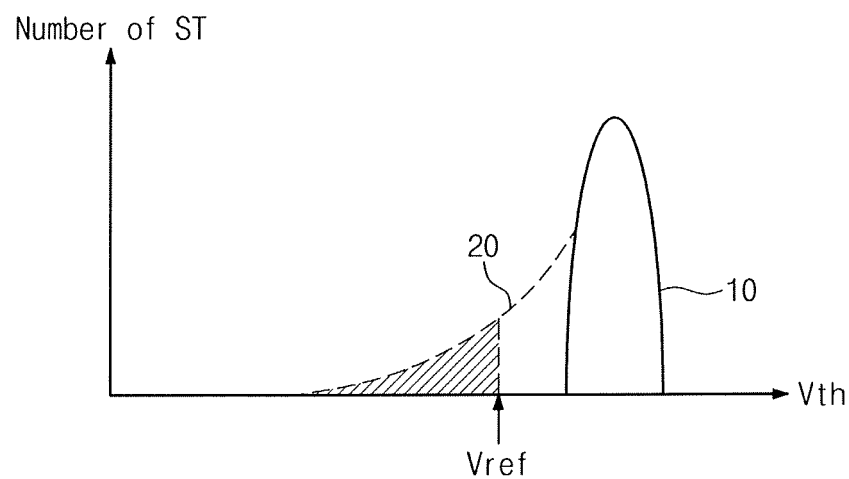
FIG. 6A is a graph showing a threshold voltage distribution, before programming of selection transistors, of the selection transistors according to an exemplary embodiment of the present inventive concept.
Figure 6B:
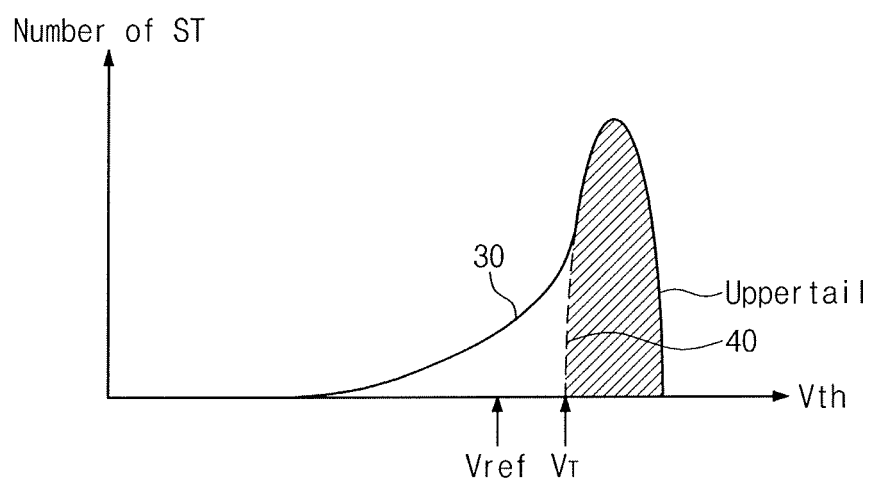
FIG. 6B is a graph depicting a threshold voltage distribution, after programming of selection transistors, of the selection transistors according to an exemplary embodiment of the present inventive concept.

FIG. 6A is a graph showing a threshold voltage distribution of a selection transistor before programmed according to an exemplary embodiment of the present inventive concept. FIG. 6B is a graph showing a threshold voltage distribution of a selection transistor after programmed according to an exemplary embodiment of the present inventive concept. The selection transistor may include a string selection transistor or a ground selection transistor.

Referring to FIG. 6A, when a memory block is initially programmed, the threshold voltage distribution of selection transistors may have a distribution represented by a solid line 10. However, as the number of program/erase cycles for the memory block increases, the distribution of selection transistors may spread to have a graph represented by a dashed line 20. Since variation in the threshold voltage distribution of the selection transistors causes variation in the current density of the selection transistors, the adjustments of the threshold voltages of the selection transistors may be necessary.

For example, if the number of selection transistors, which have a threshold voltage less than a reference voltage Vref (in the drawing, selection transistors belonging to a slashed area), from among selection transistors of a memory block is larger than a reference value, the selection transistors may be programmed to adjust threshold voltages. For example, selection transistors of a memory block determined to need to program selection transistors may be programmed to have a threshold voltage greater than a target voltage $V_T$. In FIG. 6B, a portion 30 shown by a solid line indicates a dispersion of selection transistors before they are programmed and a portion 40 shown by a dotted line indicates a dispersion of selection transistors after they are programmed. As shown in the drawing, the target voltage $V_T$ is greater than a reference voltage Vref. However, the target voltage $V_T$ may be greater than or equal to the reference voltage Vref. A program operation may be performed on selection transistors according to incremental step pulse program (ISPP) scheme such that the threshold voltage of a threshold voltage does not exceed an upper tail, excessively. For example, programming of selection transistors may be performed in idle time after a read, program or erase operation is performed on a nonvolatile memory device, or when a notification permitting a background operation to be performed is received from a host.

Alternatively, above programming operation may be performed per each selection line. In this case, if a number of selection transistors, which have a threshold voltage less than the reference voltage Vref, from among selection transistors that are connected to a selection line (e.g., string selection line or ground selection line) is larger than a reference value, the selection transistors that are connected to the selection line may be programmed to have a threshold voltage larger than the target voltage $V_T$.

As a result, performance of a data storage device may be improved by programming a selection transistor in idle time or in an background operation after an erase operation is performed on a memory block.

Figure 7:
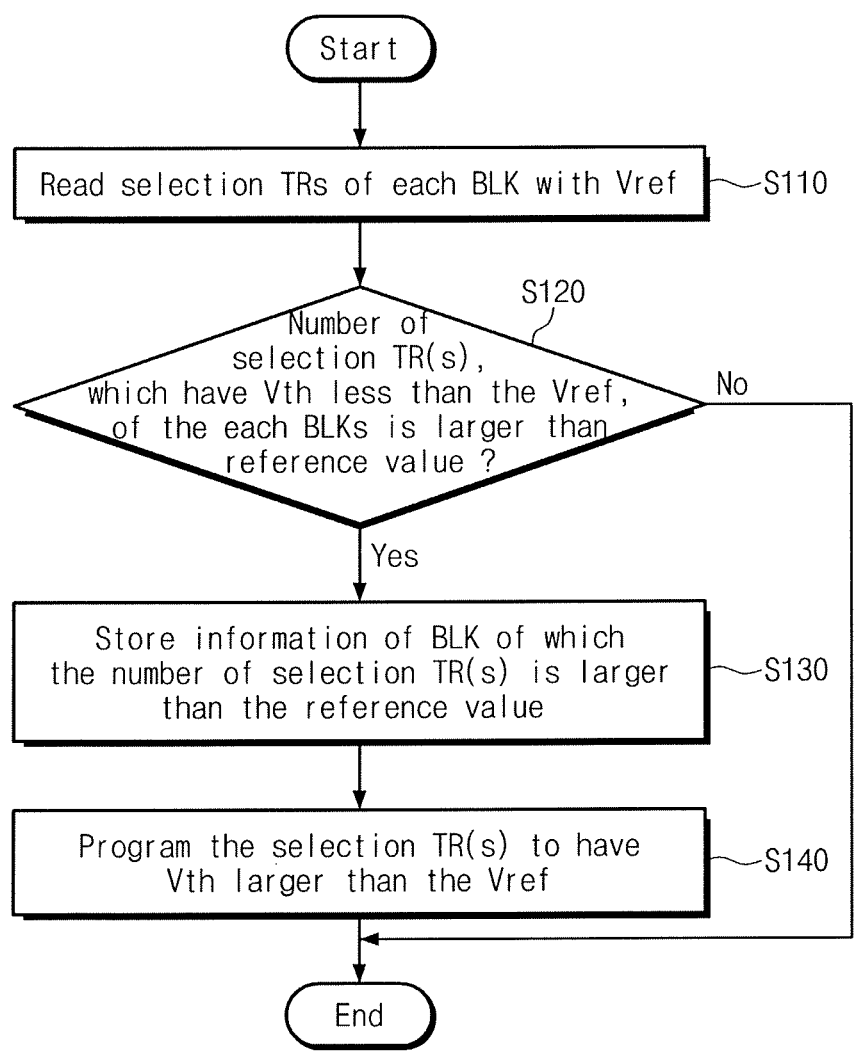
FIG. 7 is a flowchart of an operating method of a data storage device according to an exemplary embodiment of the present inventive concept.

FIG. 7 is a flowchart of an operating method of a data storage device according to an exemplary embodiment of the present inventive concept.

In step S110, selection transistors of each memory block are read with a reference voltage Vref. A selection transistor having a threshold voltage less than the reference voltage Vref may be read as an on-cell. Alternatively, reading the selection transistors with the reference voltage Vref may be perform per each selection line. For example, the step S110 may be performed immediately before or after an erase operation is performed on a memory block. However, the present inventive concept is not limited thereto, and the step S110 may be performed immediately before or after a program operation or a read operation is performed.

In step S120, a determination is made on whether the number of selection transistors having threshold voltages less than the reference voltage Vref in each memory block is smaller than a reference value. Alternatively, the determining that whether the number of selection transistors having a threshold voltage less than the reference voltage Vref is less than a reference value may be perform per each selection line. The step S120 may be performed by checking whether the number of selection transistors determined to be on-cells is larger than or equal to the reference value. If the number of the selection transistors having threshold voltages less than the reference value Vref is greater than or equal to the reference value (Yes), the flow proceeds to step S130. If the number of the selection transistors having threshold voltages less than the reference value Vref is smaller than to the reference value (No), the flow ends.

In the step S130, information about a memory block (alternatively, a selection line) in which the number of selection transistors having threshold voltages less than the reference voltage Vref is larger than or equal to the reference value is stored. The stored information may be managed by a selection transistor manager 1122 of FIG. 2. The selection transistor manager 1122 may be implemented in firmware or software, and may be loaded to the working memory 1120 of the memory controller in FIG. 2.

In step S140, the selection transistors of the memory block (alternatively, a selection line) in which the number of the selection transistors having threshold voltages less than the reference voltage Vref is smaller than the reference value are programmed to have threshold voltages greater than a target voltage. The target voltage may be greater than or equal to the reference voltage Vref. The program operation may be performed on the selection transistors according to incremental step pulse program (ISPP) scheme, but is not limited thereto.

For example, the step S140 may be performed after a predetermined time passes from a time point at which an erase operation has been performed on a memory block. In an exemplary embodiment, the step S140 may be performed after a predetermined time passes from a time point at which a read operation has been performed on a memory block. The predetermined time may include a time point at which a data storage device is in idle time after performing a read, program or erase operation on a nonvolatile memory device or a time point at which a notification permitting a background operation to be performed is received from a host. The background operation may be a power save mode or a screen-off mode notified from the host. However, the present inventive concept is not limited thereto, and the time point may be any time point that is not immediately after an erase operation is performed on a memory block.

According to an exemplary embodiment of the present inventive concept, a selection transistor is adjusted to have a threshold voltage greater than a target voltage at a time point that is not immediately after an erase operation is performed on a memory block. Thus, performance degradation such as prolongation of an erase operation may be prevented.

Figure 8:
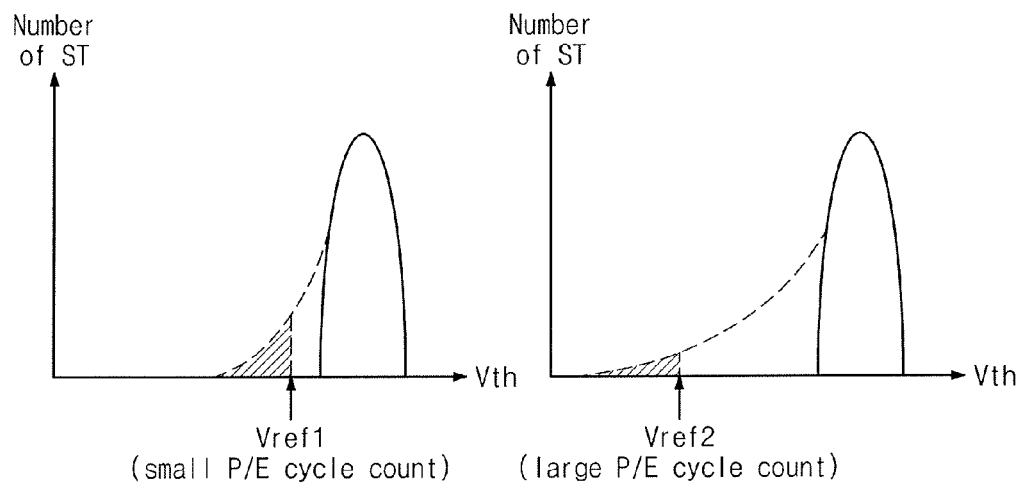
FIG. 8 is a graph depicting a reading method of step S110 in FIG. 7 according to an exemplary embodiment of the present inventive concept.

FIG. 8 shows a reading method of the step S110 in FIG. 7 according to an exemplary embodiment of the present inventive concept.

If a wear leveling algorithm is used, each block may have similar numbers of program/erase cycles. Thus, when reaching a certain cycle count of program/erase cycles, the number of selection transistors, in each block (alternatively, selection transistors connected to a selection line), having threshold voltages less than a reference voltage may exceed a reference value at substantially the same time. In this case, the selection transistors of the memory blocks may be programmed simultaneously, and thus the memory system performance may be degraded due to the programming of the selection transistors. In an exemplary embodiment, programming of the selection transistors of memory blocks may be controlled to occur in a distributed manner. For example, simultaneous programming of the selection transistors may be avoided.

A method of varying the magnitude of a reference voltage for reading selection transistor depending on a program/erase cycle count may be used to program the selection transistors in a distributed manner. Referring to FIG. 8, if a program erase/cycle count is less than a first predetermined number of a program/erase cycle count, the step of S110 in FIG. 7 may be performed using a first reference voltage Vref1. If a program/erase cycle count is greater than a second predetermined number of a program/erase cycle count, the step of S11 in FIG. 7 may be performed using a second reference voltage Vref2. In an exemplary embodiment, the second reference voltage Vref2 is smaller than the first reference voltage Vref1. In an exemplary embodiment, the first predetermined number is less than or equal to the second predetermined number. As the number of program/erase cycle count increases, the distribution of threshold voltage of the selection transistors may be spread from initial distribution. For example, the left distribution in FIG. 8 may show distribution in threshold voltage of the selection transistors, if a program/erase cycle count is less than the first predetermined number. The right distribution in FIG. 8 may show distribution in threshold voltage of the selection transistors, if a program/erase cycle count is greater than the second predetermined number of a program/erase cycle count. As a result, an operation of programming selection transistors may be performed relatively fast on some of all memory blocks. Moreover, as the program/erase cycle count increases, the magnitude of a reference voltage Vref2 may be gradually reduced to distribute a time point of occurrence of memory blocks when the number of selection transistors having threshold voltages less than a reference voltage is larger than a reference value and when the selection transistors need programming to adjust threshold voltages.

In an exemplary embodiment, the reference value may vary depending on the magnitude of the reference voltage. For example, as the magnitude of the reference voltage decreases, the magnitude of the reference value increases. As shown in FIG. 8 where the second reference voltage Vref2 is smaller than the first reference voltage Vref1, the reference value for the step S110 of FIG. 7 using the second reference voltage Vref2 is greater than the reference value for the step S110 of FIG. 7 using the first reference voltage Vref1. As a result, an operation of programming selection transistors may be performed relatively fast on some of all memory blocks. Moreover, as a program/erase cycle count increases, a reference value may increase gradually to distribute a time point of occurrence of memory blocks that need to program selection transistors.

In addition, the magnitude of a reference voltage or a first reference value may vary depending on a position of a memory block in which a selection transistor is programmed or a device temperature. For example, as the device temperature increases, a threshold voltage of a selection transistor may spread more than in a lower temperature. Thus, the magnitude of the reference voltage or the first reference value may vary depending on the device temperature to distribute a time point of occurrence of memory blocks that need to program selection transistors. Further, since the temperature of the periphery or characteristics of an oxide layer are different according to a position of a memory block (e.g. memory block is disposed in inner site or outer site of memory blocks), spreading degrees of selection transistors may be different from each other. Thus, the magnitude of a reference voltage or the first reference value may vary depending on the position of the memory block to disperse a time point of occurrence of memory blocks that need to program selection transistors. Of course, above methods may be performed per each selection line.

Figure 9:
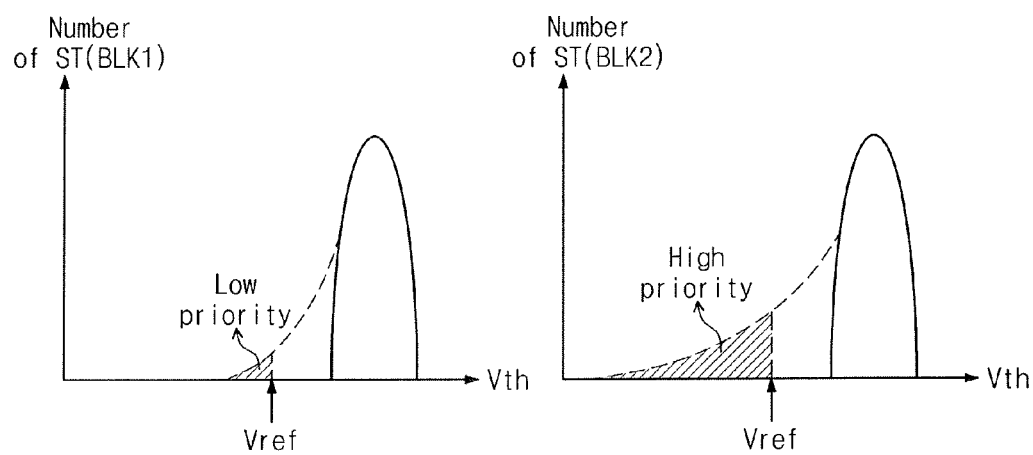
FIG. 9 is a graph depicting a programming method of step S140 in FIG. 7 according to an exemplary embodiment of the present inventive concept.

FIG. 9 shows a programming method of step S140 in FIG. 7 according to an exemplary embodiment of the present inventive concept. A programming method of a plurality of memory blocks, in which the number of selection transistors having threshold voltages less than a reference voltage Vref is larger than a reference value, determined to need to program the selection transistors will now be described below with reference to FIG. 9.

For the convenience of description, FIG. 9 shows two memory blocks BLK1 and BLK2 having different distributions than initial distributions.

The distribution variation in threshold voltages of the memory block 1 (BLK1) is smaller than that of the memory block 2 (BLK2). Accordingly, if selection transistors of respective memory blocks are read with the same reference voltage Vref, the number of the selection transistors determined to be on-cells are different in number. For the convenience of description, it is assumed that the number of the selection transistors which are determined to be on-cells in the memory block 1 is less than a predetermined number, and the number of the selection transistors which are determined to be on cells in the memory block 2 is greater than the predetermined number. In this case, it is determined that the memory block 2 (BLK2) has a higher priority than the memory block 1 (BLK1) for programming selection transistors. In an exemplary embodiment of the present inventive concept, the selection transistors of the memory block 2 are programmed such that the selection transistors have threshold voltages greater than or equal to a target threshold voltage according to the higher priority assigned to the memory block 2. As a result, the selection transistors may be programmed more efficiently. Of course, determining priority may be performed per each selection line.

Figure 10:
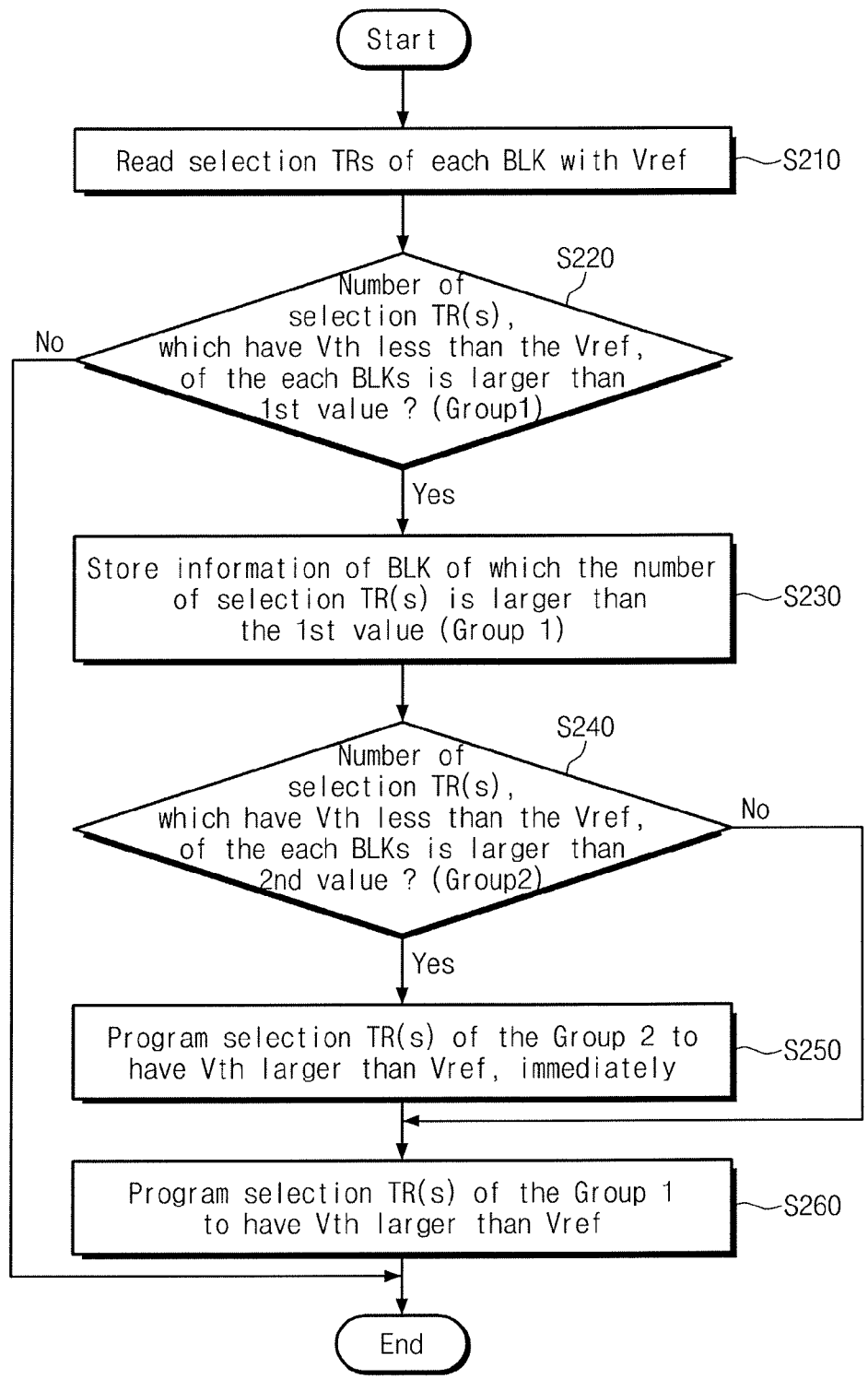
FIG. 10 is a flowchart of an operating method of a data storage device according to an exemplary embodiment of the present inventive concept.

FIG. 10 is a flowchart summarizing an operating method of a data storage device according to an exemplary embodiment of the present inventive concept.

In step S210, selection transistors of each memory block are read with a reference voltage Vref. The step S210 is similar to the step S110 in FIG. 7 and will not be described in further detail. Similarly, the step S210 may be performed according to the same method as described in FIG. 8.

In step S220, a determination is made on whether the number of selection transistors, which have threshold voltages less than the reference voltage Vref, of each memory block is larger than a first reference value. The step S220 may be performed by checking whether the number of the selection transistors determined to be the on-cells in the step S210 is larger than the first reference value. For brevity of description, a memory block may be referred to as "Group 1", if the number of the selection transistors of the memory block having the threshold voltages less than the reference voltage Vref is larger than or equal to the first reference value. When the memory block is determined to be a memory block of Group 1, the flow proceeds to step S230. When the memory block is not determined to be Group 1, the flow ends.

In the step S230, information about a memory block which belongs to the Group 1 is stored. The information of the Group 1 may be managed by a selection transistor manager 1122 (see FIG. 2). The selection transistor manager 1122 may be loaded to a working memory 1120 of a memory controller (see FIG. 2) in the form of firmware or software.

In step S240, a determination is made on whether the number of selection transistors, which have threshold voltages less than the reference voltage Vref, of each memory block is larger than a second reference value. The second reference value is greater than the first reference value. For brevity of description, a memory block may be referred to as "Group 2", if the number of the selection transistors of the memory block having the threshold voltages less than the reference voltage Vref is larger than or equal to the second reference value. A memory block belonging to the Group 2 may have the spreading degree of threshold voltages of selection transistors to the extent that the memory block needs to be programmed immediately. Operation branch occurs according to a result of the determination. If a memory block is determined to belong to the Group 2, the flow proceeds to step S250. if the Group 2 does not exist, the flow proceeds to step S260.

In the step S250, selection transistors of a memory block belonging to the Group 2 are programmed immediately. As described above, the memory block belonging to the Group 2 may have the spreading degree of threshold voltages of selection transistors to the extent that the memory block needs to be programmed immediately. Accordingly, although an erase operation is performed on a current memory block, a program operation may be performed.

In the step S260, selection transistors of a memory block belonging to the Group 1 are programmed. The step S260 may be performed after a read operation, a program operation or an erase operation is performed on a nonvolatile memory device, if the nonvolatile memory device is in idle time or if a notification permitting a background operation to be performed is received from a host. In an exemplary embodiment, if two or more memory blocks are determined as Group 1, a memory block including a larger number of selection transistors having threshold voltages less than the reference voltage Vref may have higher priority in performing a program operation. Of course, exemplary embodiment described in FIG. 10 may be performed per each selection line.

Figure 11:
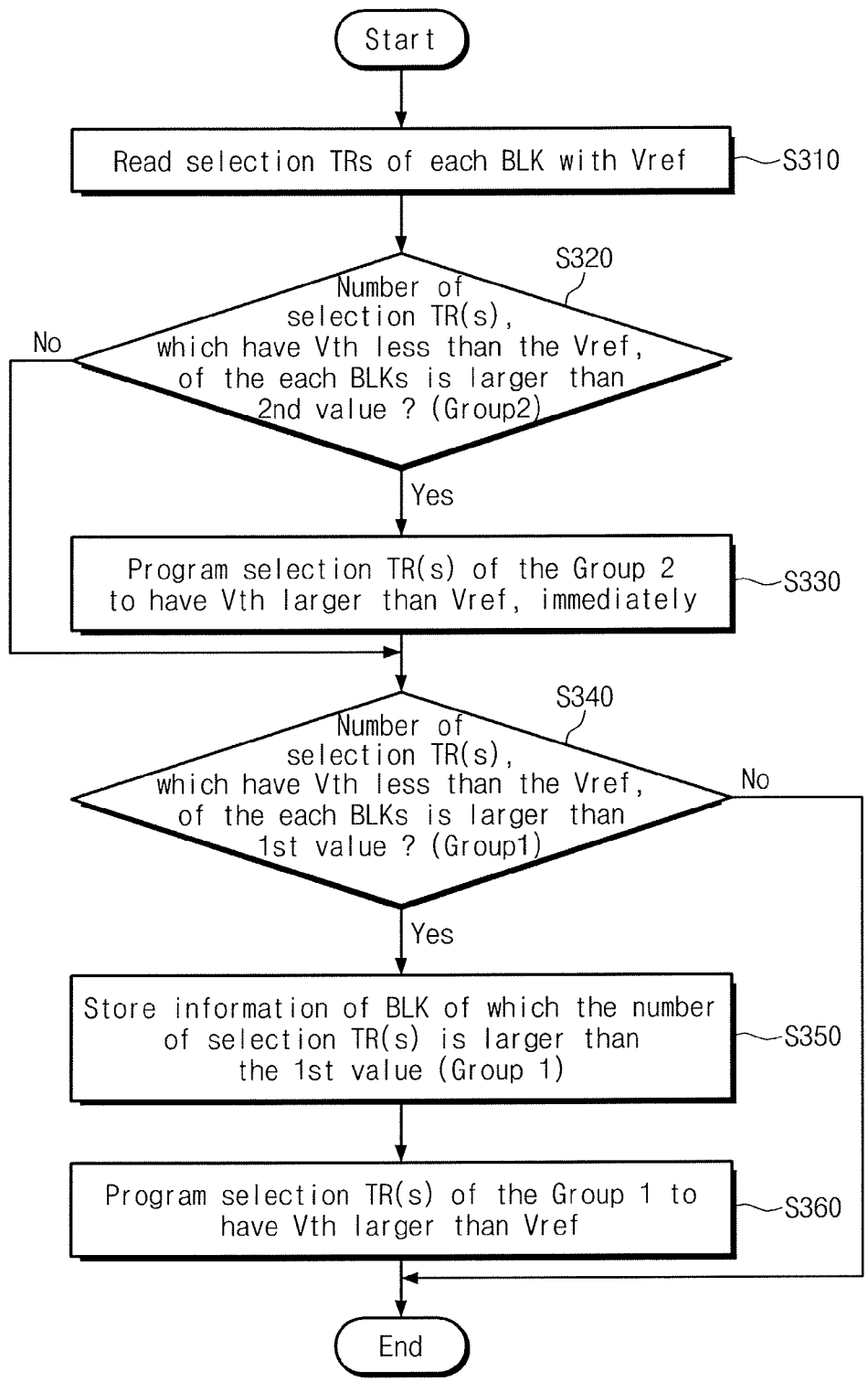
FIG. 11 is a flowchart of an operating method of a data storage device according to an exemplary embodiment of the present inventive concept.

FIG. 11 shows an operating method of a data storage device according to an exemplary embodiment of the present inventive concept.

In step S310, selection transistors of each memory block are read with a reference voltage Vref. The step S310 is similar to the step S110 in FIG. 7 and will not be described in further detail. Similarly, the step S310 may be performed according to the same method as described in FIG. 8.

In step S320, a determination is made on whether the number of selection transistors of each memory block having threshold voltages less than the reference voltage Vref is larger than a second reference value. The step S320 may be performed by checking whether the number of the selection transistors which are determined to be the on-cells in the step S310 is larger than the second reference value. For brevity of description, a memory block may be referred to as "Group 2", if the number of the selection transistors having the threshold voltages less than the reference voltage Vref is larger than or equal to the second reference value. Operation branch occurs according to a result of the determination.

If the memory block is determined to be a memory block of Group 2, the flow proceeds to step S330. When the memory block is determined not to be a memory block of Group 2, the flow proceeds to step S340.

In the step S330, selection transistors of a memory block belonging to the Group 2 are programmed immediately. As described above, since the memory block belonging to the Group 2 may have the spreading degree of threshold voltages of selection transistors to the extent that the memory block needs to be programmed immediately. Accordingly, although an erase operation is performed on a current memory block, a program operation may be performed.

In the step S340, a determination is made on whether the number of selection transistors of each memory block having threshold voltages less than the reference voltage Vref is larger than a first reference value. The first reference value is smaller than the second reference value. For brevity of description, a memory block may be referred to as "Group 1", if the number of the selection transistors having the threshold voltages less than the reference voltage Vref is larger than or equal to the first reference value. Operation branch occurs according to a result of the determination. If the memory block is determined to be a memory block of Group 1, the flow proceeds to step S350. If the memory block is determined not to be a memory block of Group 1, the flow comes to an end.

In the step S350, information of the Group 1 is stored. The information of the Group 1 may be managed by a selection transistor manager 1122 (see FIG. 2). The selection transistor manager 1122 may be loaded to a working memory 1120 of a memory controller (see FIG. 2) in the form of firmware or software.

In step S360, selection transistors of a memory block belonging to the Group 1 are programmed. The step S360 may be performed if a data storage device is in idle time or if a notification permitting a background operation to be performed is received from a host. In an exemplary embodiment, if two or more memory blocks are determined as Group 1, a memory block including a larger number of selection transistors having threshold voltages less than the reference voltage Vref may have higher priority in performing the program operation of step S360. Of course, exemplary embodiment described in FIG. 11 may be performed per each selection line.

According to the operating methods described in FIGS. 10 and 11, even immediately after an erase operation on a memory block is completed, if a memory block, immediately after an erase operation, is determined to be a memory block of Group 2, the selection transistors of the memory block may be programmed to have threshold voltages larger than a target voltage immediately upon the determination. The target voltage may be greater than or equal to a reference voltage. In addition, if a memory block is determined not to be a memory block of Group 2 and if the memory block is determined to be a memory block of Group 1, the selection transistors of the memory block may be programmed when a data storage device is in idle time or when a notification permitting a background operation to be performed is received from a host. Thus, performance of the data storage device may be increased.

Figure 12:
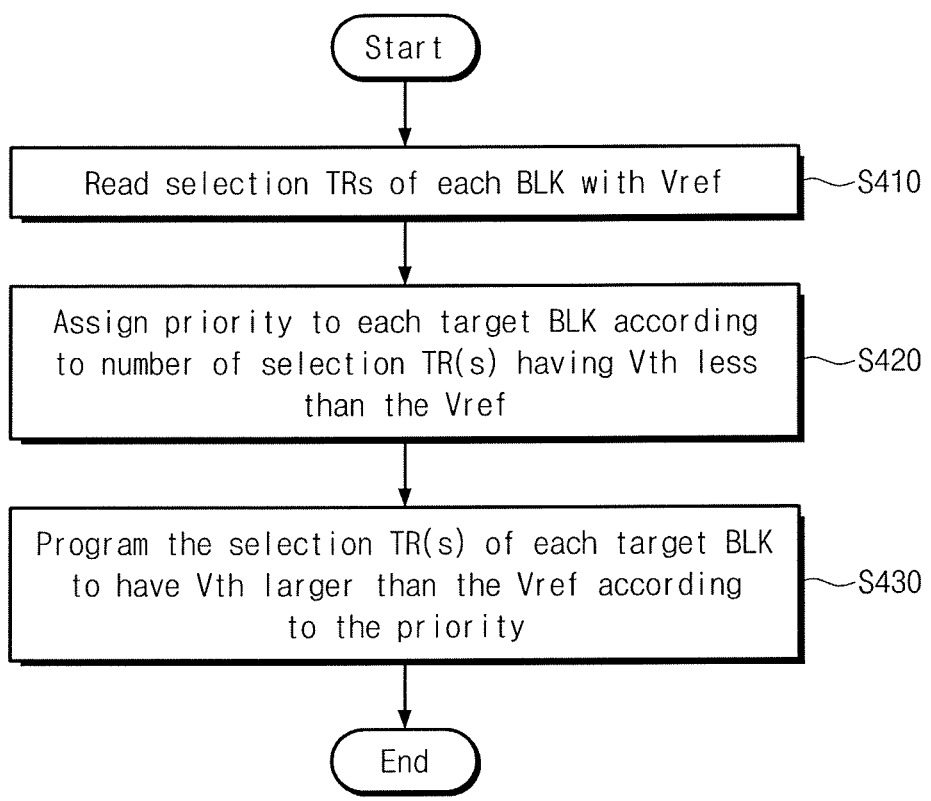
FIG. 12 is a flowchart of an operating method of a data storage device according to an exemplary embodiment of the present inventive concept.

FIG. 12 is a flowchart showing an operating method of a data storage device according to an exemplary embodiment of the present inventive concept.

In step S410, selection transistors of each memory block are read with a reference voltage Vref. The step S410 is similar to the step S110 in FIG. 7 and will not be explained in further detail. Similarly, the step S410 may be performed according to the same method as described in FIG. 8.

In step S420, order of priority is assigned to memory blocks which need to program selection transistors according to the number of selection transistors having threshold voltages less than the reference voltage Vref. Hereinafter, a memory block which needs to program selection transistors may be referred to as a target memory block, and in plural form, target memory blocks. Selection transistors having threshold voltages less than the reference voltage Vref in each target memory block may be referred to as target selection transistors. The step S420 may be performed by a selection transistor manager 1122 (see FIG. 2). In the step S420, a target memory block including the largest number of target selection transistors may be provided with top-ranked priority. Information about order of priority assigned to each target memory block may be stored in a selection transistor manager 1122 (see FIG. 2).

In step S430, selection transistors of each target memory block are sequentially programmed to have threshold voltages larger than a target voltage according to the order of priority assigned to each target memory block. The target voltage may be larger than or equal to the reference voltage Vref. For example, among target memory blocks, selection transistors of a target memory block having top-ranked priority may be programmed first. Meanwhile, selection transistors of a target memory block may be programmed last. The step S430 may be performed after a read operation, a program operation or an erase operation is performed on a nonvolatile memory device, when the memory controller is in idle time or when a notification permitting a background operation to be performed is received from a host. However, the present inventive concept is not limited thereto and the step S430 may be performed at a time point that is not immediately after the memory block is erased. In an exemplary embodiment, only target selection transistors of a target memory block may be programmed to have threshold voltages larger than a target voltage according to the order of priority assigned to the target memory block. Of course, exemplary embodiment described in FIG. 12 may be performed per each selection line.

Figure 13:
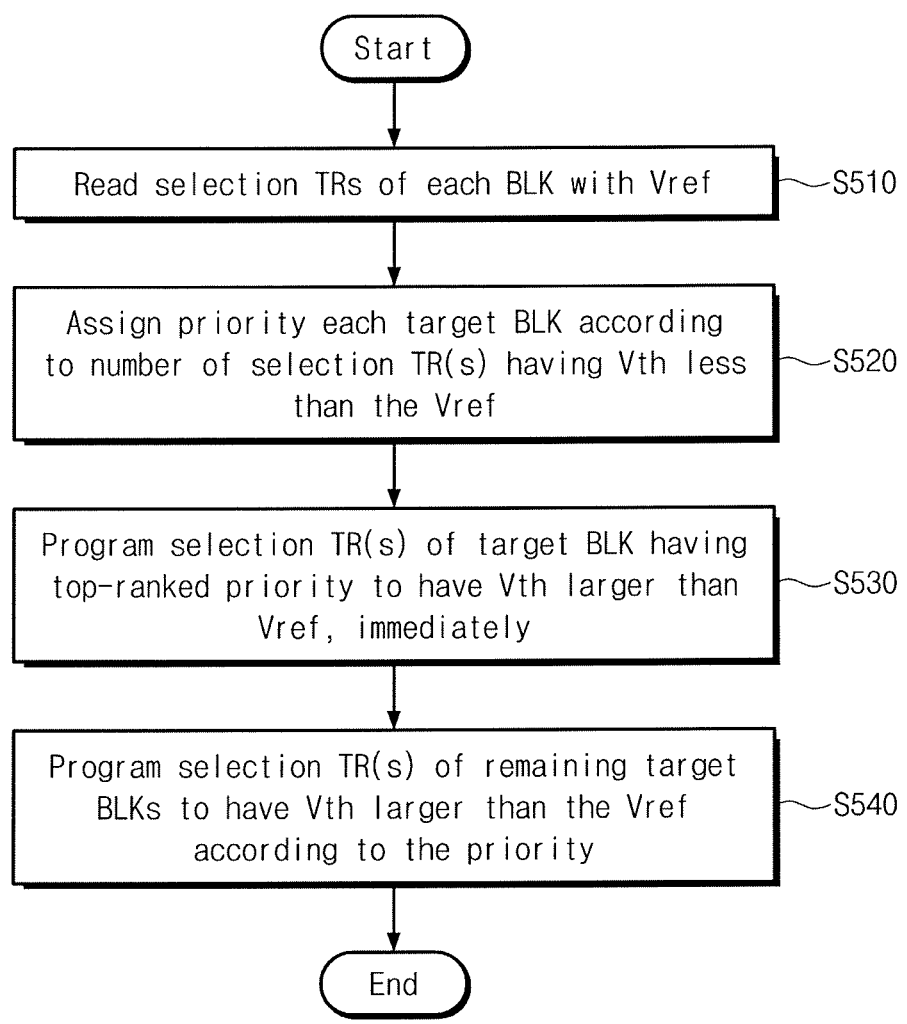
FIG. 13 is a flowchart of an operating method of a data storage device according to an exemplary embodiment of the present inventive concept.

FIG. 13 is a flowchart showing an operating method of a data storage device according to an exemplary embodiment of the present inventive concept.

In step S510, selection transistors of each memory block are read with a reference voltage Vref. The step S510 is similar to the step S110 in FIG. 7 and will not be described in further detail. Similarly, the step S510 may be performed according to the same method as described in FIG. 8.

In step S520, order of priority is assigned to target memory blocks according to the number of target selection transistors. The step S520 is similar to the step S420 in FIG. 12 and will not be described in further detail.

In step S530, selection transistors of a target memory block having top-ranked priority may be programmed to have threshold voltages less than a target voltage immediately. The target voltage may be larger than or equal to the reference voltage Vref. The target memory block provided with the top-ranked priority may be a target memory block having the spreading degree of threshold voltages of the selection transistors to the extent that immediately after an erase operation is completed on the memory block, the selection transistors need to be programmed.

In step S540, a program operation is performed on the other target memory blocks except for a programmed memory block having the top-ranked priority among memory blocks. The step S540 may be performed after a read operation, a program operation or an erase operation is performed on a nonvolatile memory device, when the memory controller is in idle time or when a notification permitting a background operation to be performed is received from a host. However, an exemplary embodiment of the present inventive concept is not limited thereto and the step S540 may be performed at a time point that is not immediately after the memory block is erased. In addition, the step S540 may be sequentially performed according to the order of priority assigned to each memory block.

According to an exemplary embodiment of the present inventive concept, a program operation is performed on memory blocks determined to need to program selection transistors. Except for a memory block that needs to program selection transistor immediately, selection transistors are programmed at a time point that is not immediately after an erase operation is performed on a memory block. For example, a selection transistor may be programmed when a data storage device is in idle time or when a notification permitting a background operation to be performed is received from a host. As a result, performance degradation of the data storage device such as prolongation of an erase operation may be prevented. Of course, exemplary embodiment described in FIG. 13 may be performed per each selection line.

Figure 14:
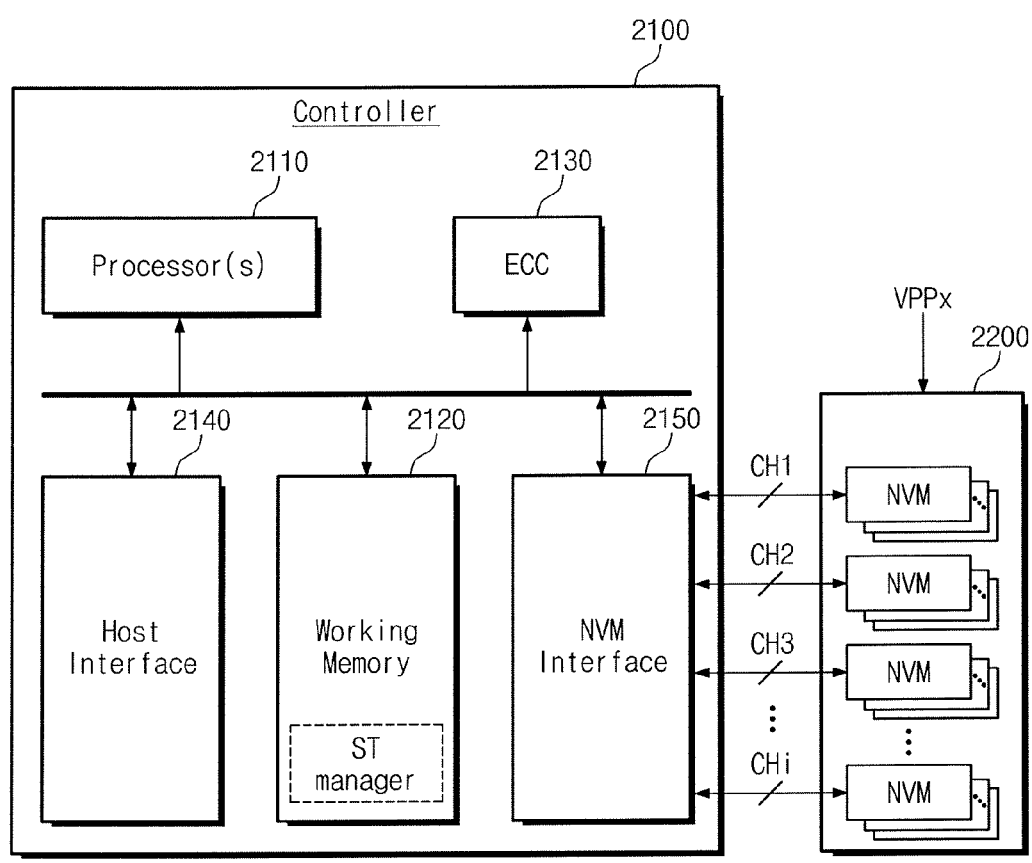
FIG. 14 is a block diagram of an SSD according to an exemplary embodiment of the present inventive concept.

FIG. 14 is a block diagram of an sold-state-drive (SSD) 2000 according to an exemplary embodiment of the present inventive concept. As illustrated, the SSD 2000 includes an SSD controller and a plurality of nonvolatile memory devices 2200.

The SSD controller 2100 is connected to the nonvolatile memory devices 2200 through a plurality of channels CH1 to CHi (i being an integer greater than or equal to 2). The SSD controller 2100 may include at least one processor 2110, a working memory 2120, an error correction code (ECC) circuit 2130, a host interface 2140, and a nonvolatile memory interface 2150.

The working memory 2120 may temporarily store data required for operation of the memory controller 2100. For example, a selection transistor manager may be loaded to the working memory 2120 in the form of firmware or software. For example, the selection transistor manager may store and manage information on memory blocks which are determined to need to program selection transistors among memory blocks constituting the nonvolatile memory device 2200.

The error correction circuit 2130 may calculate an error correction code value of data to be programmed during a write operation, correct an error of data read during a read operation based on the error correction code value, and correct an error of recovered data during a data recovery operation. Although not shown in the drawing, a code memory may be further provided to store code data required to operate the memory controller 2100. The code memory may be implemented with a nonvolatile memory device.

The host interface 2140 may provide an interface function with an external device. The host interface 2140 may be a NAND flash interface. The host interface 2140 may be implemented by various interfaces and implemented with a plurality of interfaces. The nonvolatile memory interface 2150 may provide an interface function with the nonvolatile memory device 2100.

The nonvolatile memory device 2200 may be a three-dimensional nonvolatile memory device where memory cells connected to a cell string are vertically stacked on a substrate. Optionally, the nonvolatile memory device 2200 may be configured to be supplied with an external high voltage Vpp.

The SSD 2000 may program selection transistors increase reliability of the SSD 2000 having a three-dimensional nonvolatile memory device.

The present inventive concepts may be applied to eMMC (embedded multimedia card, moviNAND, and iNAND).

Figure 15:
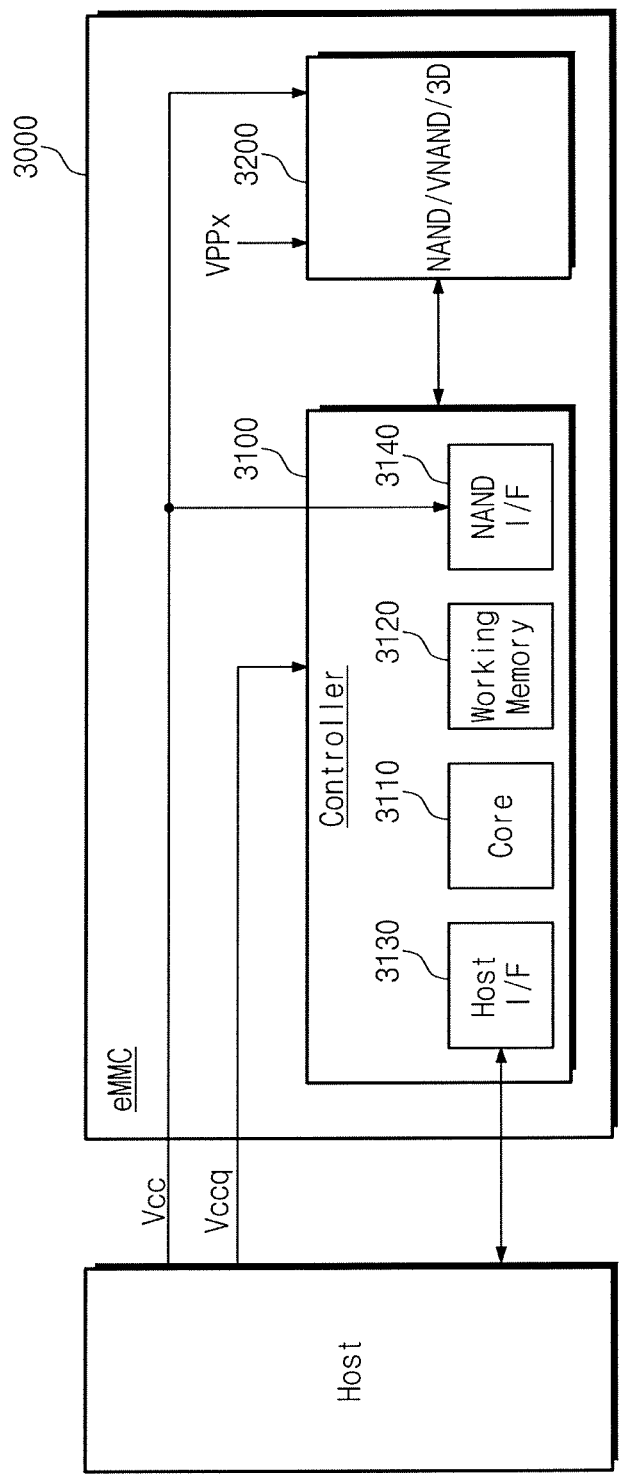
FIG. 15 is a block diagram of an eMMC according to an exemplary embodiment of the present inventive concept.

FIG. 15 is a block diagram of an eMMC 3000 according to an exemplary embodiment of the present inventive concept. As illustrated, the eMMC 3000 may include a controller 3100 and at least one NAND flash memory device 3200.

The memory controller 3100 may be connected to the NAND flash memory device 3200 through a channel. The memory controller 3100 may include at least one controller core 3110, a working memory 3120, a host interface 3130, and a NAND interface 3140. The at least one controller core 3110 may control the overall operation of the eMMC 3000. A selection transistor manager may be loaded to the working memory 3120. The host interface 3130 may provide an interface between a host and the controller 3100. The NAND interface 3140 may provide an interface between the controller 3100 and the NAND flash memory device 3200. For example, the host interface 3130 may be a parallel interface (e.g., MMC interface). For example, the host interface 3130 may be a serial interface (e.g., UHS-II, UFS interface, etc.). For example, the host interface 3130 may be a NAND interface.

The NAND flash memory device 3200 may be a three-dimensional nonvolatile memory device where memory cells connected to a cell string are vertically stacked on a substrate.

The eMMC 3000 may be supplied with power supply voltages Vcc and Vccq from the host. A first power supply voltage Vcc (e.g., 3.3 volts) may be supplied to the NAND flash memory device 3200 and the NAND interface 3140, and a second power supply voltage Vccq (e.g., 1.8 volt/3.3 volts) may be supplied to the controller 3100. For example, the eMMC may be optionally supplied with an external high voltage Vpp.

The eMMC 3000 may program selection transistors. Thus, reliability of the eMMC 3000 may be improved.

Figure 16:
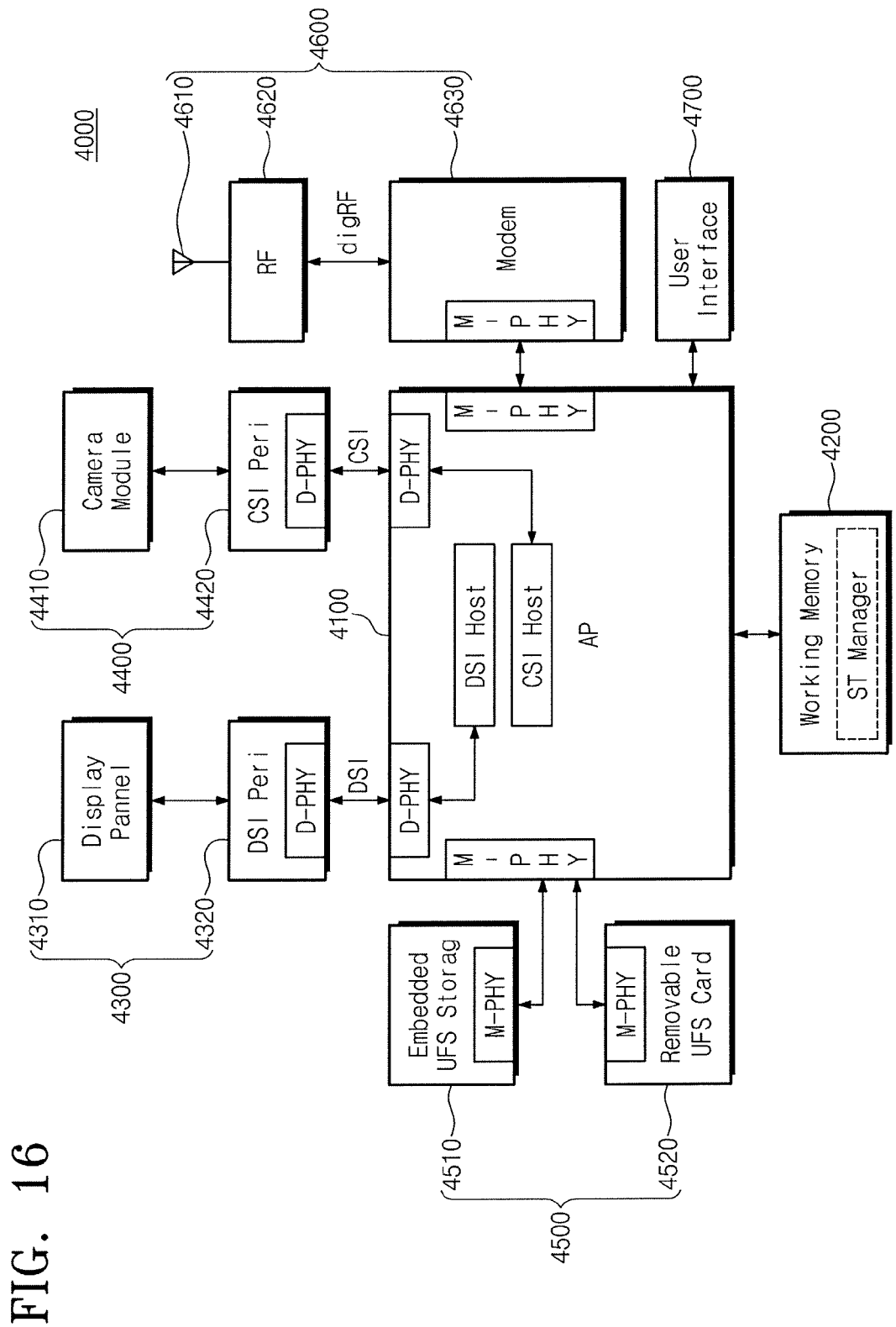
FIG. 16 is a block diagram of a mobile device including a working memory storing a selection transistor manager according to an exemplary embodiment of the present inventive concept.

FIG. 16 is a block diagram of a mobile device 4000 including a working memory storing a selection transistor manager according to an exemplary embodiment of the present inventive concept. The mobile device 4000 may be configured to support mobile industry processor interface (MIPI) standard or embedded display port (eDP) standard. As illustrated, the mobile device 4000 may include an application processor 4100, a working memory 4200, a display unit 4300, an image processor 4400, a data storage 4500, a wireless transceiver 4600, and a user interface 4800.

A selection transistor manager according to an exemplary embodiment of the present inventive concept may be loaded to the working memory. Information on transistors of respective memory blocks constituting the data storage 4500 may be managed in real time by the selection transistor manager.

The display unit 4300 may include a display panel 4310 and a display serial interface (DSI) peripheral circuit 4320. The display panel 4310 may display image data. A DSI host embedded in the application processor 4100 may perform serial communication with the display panel 4310 through a DSI. The DSI peripheral circuit 4320 may include a timing controller required to drive the display panel 4310, a data driver, and the like.

The image processor 4400 may include a camera module 4410 and a camera serial interface (CSI) peripheral circuit 4420. The camera module 4410 and the CSI peripheral circuit 4420 may include a lens, an image sensor, an image processor, and the like. Image data generated from the camera module may be processed by the image processor, and the processed image data may be transmitted to the application processor 4100 through a CSI.

The data storage 4500 may include an embedded UFS storage 4510 and a removable UFS card 4520. The embedded UFS storage 4510 and the removable UFS card 4520 may perform communication with the application processor 4100 through an M-PHY layer. A host (the application processor 4100) may include a bridge to communicate with the removable UFS card 4520 not using a UFS protocol but using another protocol. The application processor 4100 and the removable UFS card 4520 may communicate with each other using various card protocols (e.g., UFDs, MMC, eMMC SD (secure digital), mini SD, Micro SD, etc.). The embedded UFS storage 4510 and the removable UFS card 4520 may include a three-dimensional nonvolatile memory device where memory cells connected to a cell string are vertically stacked on a substrate. Information on each memory block may be stored in a meta area of the embedded UFS storage 4510 and the removable UFS card.

The wireless transceiver 4500 may include an antenna 4610, an RF unit 4620, and a modem 4630. In the drawing, the modem 4630 communicates with the application processor 4100 through the M-PHY layer. In an exemplary embodiment, the modem 4630 may be embedded in the application processor 4100.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of operating a data storage device including a nonvolatile memory device and a memory controller configured to control the nonvolatile memory device, the nonvolatile memory device including a plurality of memory blocks, each memory block including a memory cells stacked along a direction vertical to a substrate, a first cell string and a second cell string of the each memory block being connected to a bit line from among a plurality of bit lines, each cell string including selection transistors and serially-connected memory cells, the selection transistors including at least one string selection transistor (SST) and at least one ground selection transistor (GST), the SST of the first cell string and the SST of the second cell string being connected to different selection lines from among a plurality of selection lines, respectively, and the GST of the first cell string and the GST of the second cell string being connected to a same selection line from among the plurality of selection lines or different selection lines from among a plurality of selection lines, respectively, the method comprising:

reading first selection transistors connected to a first selection line from among the plurality of selection lines with a reference voltage;

determining whether a first number of selection transistors, from among the first selection transistors, which have a threshold voltage less than the reference voltage is larger than a first reference value;
if the first number is larger than the first reference value, programming the first selection transistors to have threshold voltage larger than or equal to a target voltage;
reading second selection transistors connected to a second selection line from among the plurality of selection lines with the reference voltage;
determining whether a second number of selection transistors, from among the second selection transistors, which have a threshold voltage less than the reference voltage is larger than the first reference value;
determining priority of the first selection transistors and the second selection transistors based on the first number and the second number; and
if the second number is larger than the first reference value, programming the first selection transistors or the second selection transistors, to have threshold voltage larger than or equal to the target voltage based on the priority.

2. The method of claim 1,
wherein the reading of the first selection transistors is performed before or after an erase operation is performed on the memory block.

3. The method of claim 1, further comprising:
storing a result of the determination in the memory controller.

4. The method of claim 1,
wherein programming the first selection transistors or the second selection transistors is performed after a read operation, a program operation or an erase operation on the nonvolatile memory device, if the memory controller is in idle time, or if a notification permitting a background operation to be performed is received from a host.

5. The method of claim 1, further comprising:
determining whether the first number of selection transistors, from among the first selection transistors, which have a threshold voltage less than the reference voltage is larger than a second reference value which is larger than the first reference value.

6. The method of claim 5, further comprising:
if the first number is larger than the second reference value, programming the first selection transistors to have threshold voltage larger than or equal to the target voltage, immediately.

7. The method of claim 1,
wherein magnitude of the reference voltage or the first reference value varies depending on a program/erase cycle count of the nonvolatile memory device, a position of a programmed memory block in the nonvolatile memory device or an ambient temperature.

8. The method of claim 1,
wherein a magnitude of the target voltage is larger than or equal to a magnitude of the reference voltage.

9. The method of claim 1,
wherein the selection transistors and the memory cells have the same structure as charge trap transistor.

10. A method of operating a data storage device including a nonvolatile memory device and a memory controller configured to control the nonvolatile memory device, the nonvolatile memory device including a plurality of memory blocks, each memory block including a memory cells stacked along a direction vertical to a substrate, a first cell string and a second cell string of the each memory block being connected to a bit line from among a plurality of bit lines, each cell string including selection transistors and serially-connected memory cells, the selection transistors including at least one string selection transistor (SST) and at least one ground selection transistor (GST), the SST of the first cell string and the SST of the second cell string being connected to different selection lines from among a plurality of selection lines, respectively, and the GST of the first cell string and the GST of the second cell string being connected to a same selection line from among the plurality of selection lines or different selection lines from among a plurality of selection lines, respectively,
the method comprising:
reading selection transistors connected to at least one selection line of a first memory block with a reference voltage;
determining whether a first number of selection transistors, connected to the at least one selection line of the first memory block, which have a threshold voltage less than the reference voltage is larger than a first reference value; and
if the first number is larger than the first reference value, programming the selection transistors connected to the at least one selection line of the first memory block to have threshold voltage larger than or equal to a target voltage,
wherein programming the selection transistors connected to the at least one selection line of the first memory block or the selection transistors connected to at least one selection line of a second memory block is performed after a read operation, a program operation or an erase operation on the nonvolatile memory device, if the memory controller is in idle time, or if notification permitting a background operation to be performed is received from a host.

11. The method of claim 10,
wherein reading the selection transistors is performed before or after an erase operation is performed on the first memory block.

12. The method of claim 10, further comprising:
storing a result of the determination in the memory controller.

13. The method of claim 10, further comprising:
reading selection transistors connected to at least one selection line of the second memory block with the reference voltage;
determining whether a second number of selection transistors, connected to the at least one selection line of the second memory block, which have a threshold voltage less than the reference voltage is larger than the first reference value;
determining priority of the first memory block and the second memory block based on the first number and the second number; and
if the second number is larger than the first reference value, programming the selection transistors connected to the at least one selection line of the first memory block or the selection transistors connected to the at least one selection line of the second memory block, to have threshold voltage larger than or equal to the target voltage based on the priority.

14. The method of claim 10, further comprising:
determining whether the first number of selection transistors, connected to the at least one selection line of the first memory block, which have a threshold voltage less than the reference voltage is larger than a second reference value which is larger than the first reference value.

15. The method of claim 14, further comprising:
if the first number is larger than the second reference value, programming the selection transistors connected to the at least one selection line of the first memory block to have threshold voltage larger than or equal to the target voltage, immediately.

16. The method of claim 10,
wherein magnitude of the reference voltage or the first reference value varies depending on a program/erase cycle count of the nonvolatile memory device, a position of a programmed memory block in the nonvolatile memory device or an ambient temperature.

17. The method of claim 10,
wherein a magnitude of the target voltage is larger than or equal to a magnitude of the reference voltage.

18. The method of claim 10, wherein the selection transistors and the memory cells have the same structure as charge trap transistor.

* * * * *